(12) United States Patent
Chen et al.

(10) Patent No.: US 11,948,938 B2
(45) Date of Patent: Apr. 2, 2024

(54) RECESSED GATE FOR AN MV DEVICE

(71) Applicant: Taiwan Semiconductor Manufacturing Company, Ltd., Hsin-Chu (TW)

(72) Inventors: Yi-Huan Chen, Hsin Chu (TW); Chien-Chih Chou, New Taipei (TW); Ta-Wei Lin, Minxiong Township (TW); Hsiao-Chin Tuan, Taowan (TW); Alexander Kalnitsky, San Francisco, CA (US); Kong-Beng Thei, Pao-Shan Village (TW); Shi-Chuang Hsiao, New Taipei (TW); Yu-Hong Kuo, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/866,870

(22) Filed: Jul. 18, 2022

(65) Prior Publication Data
US 2022/0352152 A1    Nov. 3, 2022

Related U.S. Application Data

(62) Division of application No. 16/412,852, filed on May 15, 2019, now Pat. No. 11,527,531.

(Continued)

(51) Int. Cl.
*H01L 29/78* (2006.01)
*H01L 27/088* (2006.01)
(Continued)

(52) U.S. Cl.
CPC ........ *H01L 27/088* (2013.01); *H01L 29/4236* (2013.01); *H01L 29/42364* (2013.01);
(Continued)

(58) Field of Classification Search
CPC .......... H01L 29/66621; H01L 29/4236; H01L 29/7833; H01L 29/7836; H01L 29/42376;
(Continued)

(56) References Cited

U.S. PATENT DOCUMENTS

| 5,712,503 A | * | 1/1998 | Kim | ..................... H01L 29/7836 257/E29.267 |
| 2001/0033000 A1 | * | 10/2001 | Mistry | ................ H01L 29/7834 257/E29.267 |

(Continued)

OTHER PUBLICATIONS

Non-Final Office Action dated Oct. 7, 2021 for U.S. Appl. No. 16/412,852.

(Continued)

*Primary Examiner* — Eric K Ashbahian
(74) *Attorney, Agent, or Firm* — Eschweiler & Potashnik, LLC

(57) ABSTRACT

In some embodiments, the present disclosure relates to a semiconductor device comprising a source and drain region arranged within a substrate. A conductive gate is disposed over a doped region of the substrate. A gate dielectric layer is disposed between the source region and the drain region and separates the conductive gate from the doped region. A bottommost surface of the gate dielectric layer is below a topmost surface of the substrate. First and second sidewall spacers are arranged along first and second sides of the conductive gate, respectively. An inner portion of the first sidewall spacer and an inner portion of the second sidewall spacer respectively cover a first and second top surface of the gate dielectric layer. A drain extension region and a source extension region respectively separate the drain region and the source region from the gate dielectric layer.

20 Claims, 10 Drawing Sheets

Related U.S. Application Data

(60) Provisional application No. 62/738,411, filed on Sep. 28, 2018.

(51) Int. Cl.
*H01L 29/423* (2006.01)
*H01L 29/66* (2006.01)

(52) U.S. Cl.
CPC .... *H01L 29/6653* (2013.01); *H01L 29/66621* (2013.01); *H01L 29/7836* (2013.01)

(58) Field of Classification Search
CPC ..... H01L 21/823456; H01L 21/823437; H01L 29/6659; H01L 29/66545; H01L 27/088
See application file for complete search history.

(56) References Cited

U.S. PATENT DOCUMENTS

| | | |
|---|---|---|
| 2004/0248348 A1 | 12/2004 | Rausch et al. |
| 2005/0059215 A1 | 3/2005 | Kim et al. |
| 2005/0275042 A1 | 12/2005 | Hwang et al. |
| 2007/0007571 A1* | 1/2007 | Lindsay .............. H01L 29/6659 257/E21.345 |
| 2008/0311715 A1* | 12/2008 | Hu ........................ H01L 29/105 438/278 |
| 2009/0212332 A1 | 8/2009 | Wang et al. |
| 2011/0156136 A1* | 6/2011 | Amari ................. H01L 29/7827 257/E21.409 |
| 2011/0193166 A1* | 8/2011 | Liang .................. H01L 21/8221 257/E21.411 |
| 2014/0103455 A1 | 4/2014 | Ando et al. |
| 2016/0163601 A1* | 6/2016 | Xie ................... H01L 29/66545 438/591 |
| 2016/0351625 A1 | 12/2016 | Gee et al. |
| 2017/0194320 A1 | 7/2017 | Chen et al. |
| 2018/0240908 A1 | 8/2018 | Amari |
| 2018/0248013 A1* | 8/2018 | Chowdhury ........ H01L 29/7833 |
| 2019/0043952 A1 | 2/2019 | Thomas et al. |

OTHER PUBLICATIONS

Final Office Action dated Jun. 1, 2022 for U.S. Appl. No. 16/412,852.
Notice of Allowance dated Jul. 27, 2022 for U.S. Appl. No. 16/412,852.

\* cited by examiner

RECESSED GATE FOR AN MV DEVICE

REFERENCE TO RELATED APPLICATIONS

This application is a Divisional of U.S. application Ser. No. 16/412,852, filed on May 15, 2019, which claims the benefit of U.S. Provisional Application No. 62/738,411, filed on Sep. 28, 2018. The contents of the above-referenced patent applications are hereby incorporated by reference in their entirety.

BACKGROUND

Many electronic devices contain a multitude of metal oxide semiconductor field-effect transistors (MOSFETs). A MOSFET includes a gate arranged between a source and a drain. MOSFETs may be categorized as high voltage (HV), medium voltage (MV) or low voltage (LV) devices, depending on the magnitude of the voltage applied to the gate to turn the MOSFET on. The structural design parameters of each MOSFET in an electronic device vary depending on the desired electrical properties.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
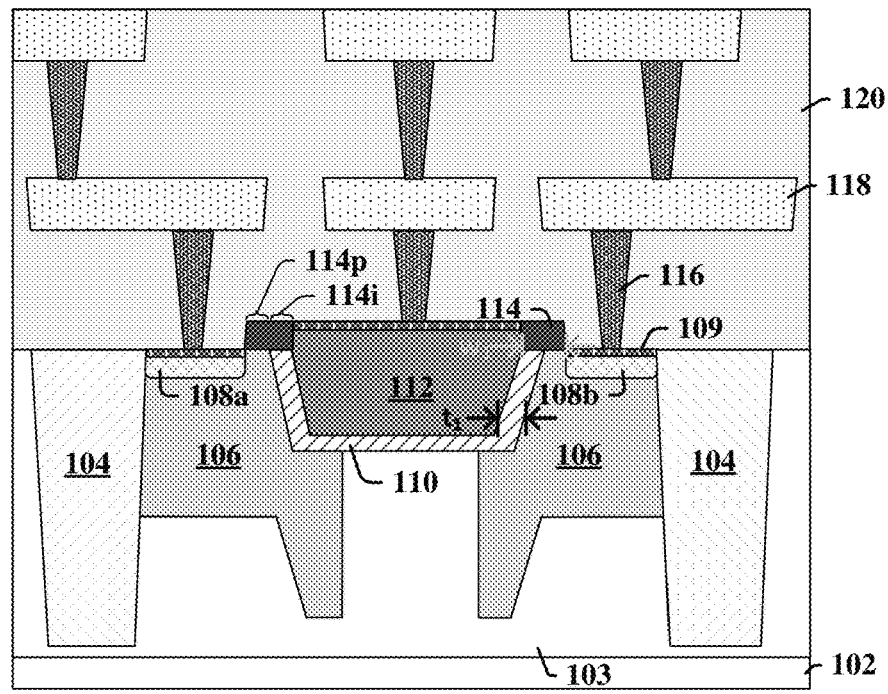
FIG. 1 illustrates a cross-sectional view of some embodiments of a MOSFET comprising a gate structure recessed below a top surface of a substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A gate structure of a metal oxide semiconductor field-effect transistor (MOSFET) may be formed by depositing a gate dielectric layer over a semiconductor substrate. Then, a gate layer is deposited over the gate dielectric layer and the gate layer and gate dielectric layer are patterned to form a gate structure. The gate dielectric layer is formed to a thickness that prevents gate leakage from occurring while allowing the transistor to still turn at a desired voltage, known as the threshold voltage. MOSFETs with high threshold voltages often include thick gate dielectric layers, whereas MOSFETs with low threshold voltages often include thin gate dielectric layers.

During manufacturing, multiple MOSFETs may be formed on a wafer at one time. Some MOSFETs may be, for example, low voltage (LV) devices, whereas other MOSFETs may be, for example, medium voltage (MV) devices. Integration of the manufacturing of LV and MV devices is even more of a challenge as critical dimensions are becoming smaller (e.g., less than 28 nm). A MV MOSFET utilizes a thicker gate dielectric layer than a LV MOSFET. In some cases, a MV device may be characterized by a threshold voltage in the range of between approximately 6 volts and approximately 32 volts. Manufacturing of MOSFETs utilizes planarization processes (e.g., chemical mechanical planarization), specifically to planarize the gate layer. A gate layer of the same thickness may be simultaneously deposited and patterned on each MV and LV MOSFET. When the gate layer is planarized, the resulting MV gate has a smaller height, and possibly insufficient height, than the height of the resulting LV gate because the MV gate was above a thicker gate dielectric layer than the gate dielectric layer of LV MOSFET. In some cases, the MV gate may be completely removed by the planarization process by the time the LV gate is reached for planarization. Thus, manufacturing processes of many MOSFETs associated with different threshold voltages on one wafer may be improved such that a single gate layer of a uniform thickness may be deposited and be planarized to form gate structures having the same height above the wafer surface.

The present disclosure, in some embodiments, relates to a new gate structure and corresponding manufacturing method to produce a reliable MOSFET. The new gate structure utilizes a recess in a semiconductor substrate such that a gate dielectric layer is formed within the recess, and a gate is formed over the gate dielectric layer. Sidewall spacers are used to protect the gate dielectric layer from source/drain regions and silicide layers. The recess accommodates varying thicknesses of a gate dielectric layer and allows for better height control of the gate during manufacturing of multiple MOSFETs on a wafer. The manufacturing method to produce the new gate structure increases efficiency by simplifying steps and reduces costs without impacting device performance. Applications that utilize the disclosed gate structure and manufacturing method utilize devices that have different threshold voltages and thus different gate dielectric layer thickness integrated on one wafer. Examples of such applications include power management devices, embedded flash memory (or other non-volatile memory), image sensing devices, and devices to drive DC motors.

FIG. 1 illustrates a cross-sectional view of an exemplary MOSFET 100 formed on a substrate 102, such as a monocrystalline silicon substrate, a silicon-on-insulator substrate, or some other semiconductor substrate. Embedded within the substrate is a doped region 103 (e.g., n-type or p-type), which may also be referred to as a well. Isolation structures 104, in some embodiments, are located near outer edges of the doped region 103. The isolation structures 104 may be, for example, shallow-trench isolation (STI) structures made of silicon-dioxide. Between the isolation structures are lightly doped drain (LDD) regions, also referred to as source/drain extension regions 106. The source/drain extension regions 106 have a different doping type than the doped region 103. The source/drain extension regions 106 are spaced apart by a portion of the doped region 103. A source region 108a and a drain region 108b are arranged below a top surface of the substrate 102 on outer sides of the source/drain extension regions 106. The source region 108a and the drain region 108b have the same doping type as the source/drain extension regions 106 and have a higher doping concentration than the source/drain extension regions 106.

A gate 112 is arranged over a gate dielectric layer 110 and is arranged between the source region 108a and the drain region 108b. The gate dielectric layer 110 is located within a recess in the substrate 102, such that the gate dielectric layer 110 is below a topmost surface of the substrate 102. In some embodiments, the gate 112 is also arranged within the recess, as illustrated in FIG. 1. Thus, the gate 112 can have a bottommost surface that is below a topmost surface of the substrate 102 and a topmost surface that is above the topmost surface of the substrate 102. The recess in the substrate 102 allows for multiple MOSFETs that have different gate dielectric layer thicknesses to be processed simultaneously on one substrate 102.

Sidewall spacers 114 surround portions of the gate 112. In some embodiments, inner portions 114i of the sidewall spacers 114 are disposed along and contact outer sidewalls of the gate 112 that are above the topmost surface of the substrate 102. The inner portions 114i of the sidewall spacers 114 also cover top surfaces of the gate dielectric layer 110. Peripheral portions 114p of the sidewall spacers 114 are spaced apart from the outer sidewalls of the gate 112 by the inner portions 114i of the sidewall spacers 114. The sidewall spacers 114 often have a substantially planar upper surface that is coplanar with an upper surface of the gate 112, which may indicate that the sidewall spacers 114 and the gate 112 were planarized in one step during manufacturing. The sidewall spacers 114 have a maximum width $w_1$ that is wider than a maximum thickness $t_1$ of the gate dielectric layer 110. Because the sidewall spacers 114 are wide, the inner portions 114i of the sidewall spacers 114 cover the gate dielectric layer 110, and the peripheral portions 114p of the sidewall spacers 114 cover a portion of the source/drain extension regions 106 such that during processing, the gate dielectric layer 110 is separated from the source region 108a, drain region 108b, and silicide layer 109 by portions of the source/drain extension regions 106. Separation of the gate dielectric layer 110 from the source region 108a, drain region 108b, and silicide layer 109 protects the gate dielectric layer 110 from degradation. Contacts 116 couple the source region 108a, the drain region 108b and the gate 112 to an interconnect metal layer 118. The contacts 116 and interconnect metal layer 118 are embedded an inter-layer dielectric (ILD) layer 120. The silicide layers 109 facilitate ohmic contacts between the contacts 116 and the source/drain regions 108a, 108b.

Figure 2:
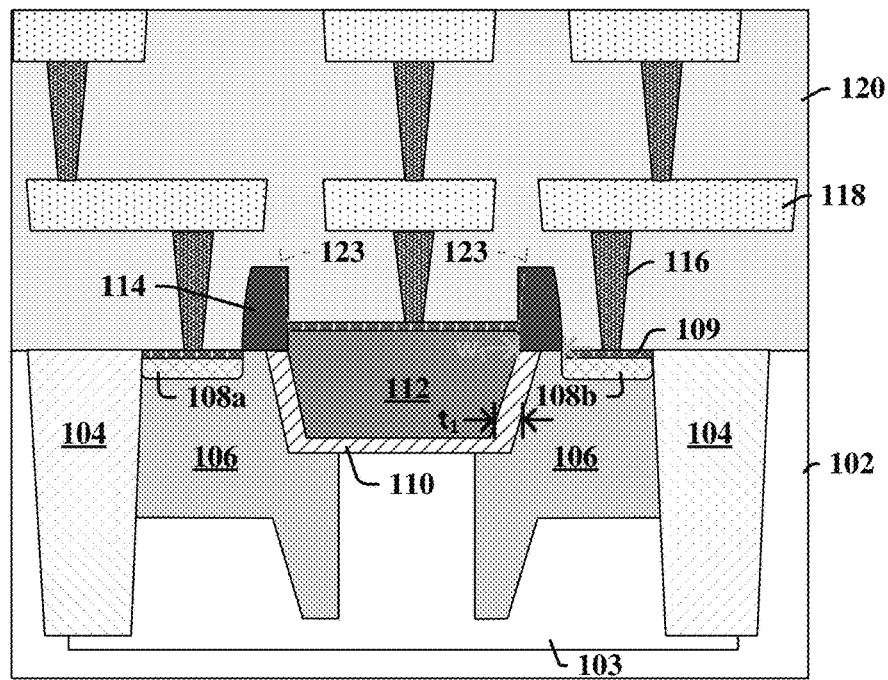
FIG. 2 illustrates a cross-sectional view of some additional embodiments of a MOSFET comprising a gate structure recessed below a top surface of a substrate.

FIG. 2 illustrates an additional embodiment of a cross-sectional view of a MOSFET 200 having a gate dielectric layer 110 recessed below a top surface of a substrate 102.

The MOSFET 200 comprises the same elements as MOSFET 100, except for exhibiting sidewall spacers 114 having a different height. In some embodiments, the sidewall spacers 114 may have top surfaces that are arranged above a topmost surface of the gate 112. The top surface of gate 112 is substantially planar. This MOSFET 200 may indicate a different manufacturing sequence, specifically planarization steps, than the previously described MOSFET 100. The sidewalls spacers 114 in this MOSFET 200 still achieve their purpose as the sidewall spacers 114 that have a larger maximum width $w_1$ than a maximum thickness $t_1$ of the gate dielectric layer 110. The sidewall spacers 114 may, for example, have a maximum width $w_1$ within a range of between approximately 15 nanometers and approximately 100 nanometers. The gate dielectric layer 110 may, for example, have a maximum thickness $t_1$ within a range of between 100 angstroms and 200 angstroms. The sidewall spacers 114 have inner portions (114i of FIG. 1) that cover top surfaces of the gate dielectric layer 110, and the sidewall spacers 114 have peripheral portions (114p of FIG. 1) that cover top surfaces of source/drain extension regions 106, such that silicide layers 109 are spaced apart from the gate dielectric layer 110 to prevent degradation of the gate dielectric layer 110. In some embodiments, the sidewalls spacers have inner sidewalls that are vertical as illustrated, but in other embodiments inner sidewalls of the sidewalls spacers are tapered (see line 123).

Figure 3:
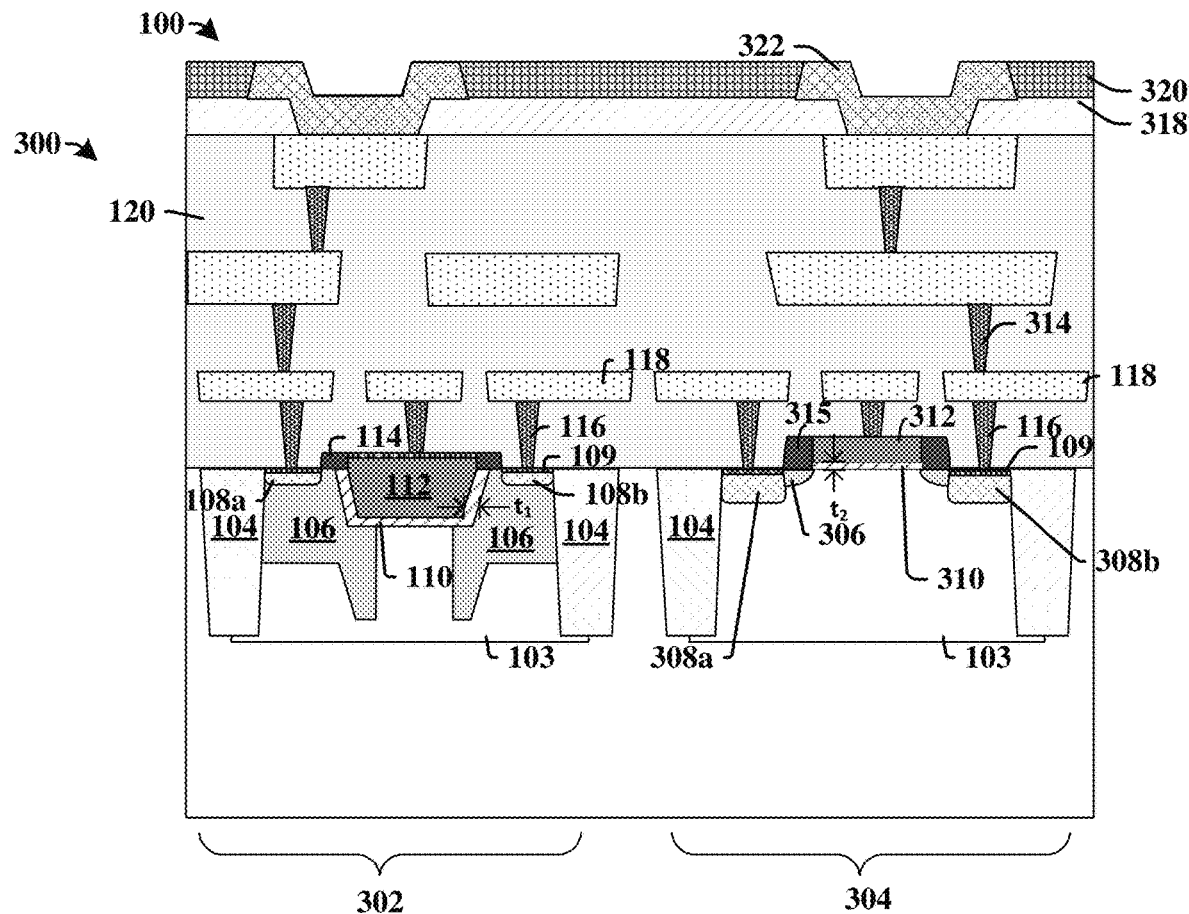
FIG. 3 illustrates a cross-sectional view of some embodiments of an integrated semiconductor device comprising a recessed gate structure MOSFET and a non-recess gate structure MOSFET.

FIG. 3 illustrates an additional embodiment of a semiconductor device 300 having a recessed gate MOSFET region 302 adjacent to a non-recessed gate MOSFET region 304.

The recessed gate MOSFET region 302 may be, for example, a medium voltage (MV) MOSFET when compared to the non-recessed gate MOSFET region 304. A MV device may turn "on" when voltages in the range of approximately 6 volts to approximately 32 volts are applied to the MOSFET. A MV device includes a thicker gate dielectric layer than a LV device due to higher threshold voltages. Therefore, the non-recessed gate MOSFET region 304 may comprise a low voltage (LV) MOSFET because the recessed gate MOSFET region 302 comprises a gate dielectric layer 110 with a maximum thickness $t_1$ that is greater than a maximum thickness $t_2$ of a LV gate dielectric layer 310 in the non-recessed gate MOSFET region 304. The maximum thickness $t_1$ of gate dielectric layer 110 may be in a range of between approximately 100 angstroms and approximately 200 angstroms. A bottommost surface of the gate 112 is lower than a bottommost surface of an LV gate 312. However, a topmost surface of the gate 112 is about level with a topmost surface of the LV gate 312 because gate 112 is recessed to accommodate for the gate dielectric layer 110 being thicker than LV gate dielectric layer 310. Additionally, the level surfaces of the gate 112 and the LV gate 312 indicates that the gate 112 and the LV gate 312 were planarized simultaneously during manufacturing. By simultaneously planarizing the gate 112 and the LV gate 312 on one wafer, manufacturing is more efficient.

LV sidewall spacers 315 in the non-recessed gate MOSFET region 304 have inner and outer portions that cover LV source/drain extension regions 306. The LV source/drain extension regions 306 may be arranged beside the LV source region 308a and LV drain region 308b and below the LV sidewall spacers 315 as depicted in FIG. 3. In other embodiments (not shown), the LV source/drain extension regions 306 may also extend below the LV source region 308a and the LV drain region 308b, similar to the source/drain extension regions 106 in the recessed gate MOSFET region 302. The LV gate dielectric layer 310 is beside the LV sidewall spacers 315. The LV sidewall spacers 315 separate the silicide layers 109 on the LV source region 308a and the LV drain region 308b from the LV gate dielectric layer 310. In some embodiments, the LV sidewall spacers 315 may have a same maximum width as the sidewall spacers 114, indicating that the LV sidewall spacers 315 were formed in the same steps as the sidewall spacers 114 during manufacturing. In the non-recessed gate MOSFET region 304, the LV source region 308a and LV drain region 308b have bottommost surfaces that are arranged below a bottommost surface of the LV gate dielectric layer 310, whereas in the recessed gate MOSFET region 302, the source region 108a and the drain region 108b have bottommost surfaces that are arranged above a bottommost surface of the gate dielectric layer 110. In some embodiments (not shown), the LV source region 308a, LV drain region 308b, source region 108a and drain region 108b may have a same depth into the substrate 102, indicating that the LV source region 308a, the LV drain region 308b, the source region 108a and the drain region 108b were simultaneously formed during one step in the manufacturing process.

Both the recessed gate MOSFET region 302 and the non-recessed gate MOSFET region 304 are coupled to electrical contact pads 322 through contacts 116 coupled to alternating interconnect metal layers 118 and interconnect metal vias 314. The contacts 116 may be coupled to the silicide layers 109 on the LV source/drain regions 308a/308b and on the source/drain regions 108a/108b. Silicide layers 109 may also be on the gate 112 and the LV gate 312 in some embodiments (not shown). The electrical contact pads 322 are made of a conductive material such as, for example, aluminum and/or copper. The contacts 116 and interconnect metal layers 118 are embedded in inter-layer dielectric (ILD) layers 120. The electrical contact pads 322 are surrounded by one or more passivation layer(s), such as 318, 320, for protection.

FIGS. 4-17 illustrate cross-sectional views 400-1700 of some embodiments of a method of forming an integrated chip having a MOSFET. Although FIGS. 4-17 are described in relation to a method, it will be appreciated that the structures disclosed in FIGS. 4-17 are not limited to such a method, but instead may stand alone as structures independent of the method.

As shown in cross-sectional view 400, a substrate 102 is provided. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor material. In some embodiments, isolation structures 104 may be formed within the substrate 102. The isolation structures 104 may be formed by selectively etching the substrate 102 to form a trench defined by sidewalls of the substrate 102. The trench is subsequently filled with one or more dielectric materials, such as, for example, silicon-dioxide, forming the isolation structures 104. A recess 402 is then formed by photolithography and subsequent etching of the substrate 102 between the isolation structures to a depth $h_1$ within a range, for example, of between approximately 700 angstroms and approximately 1000 angstroms. The substrate 102 then undergoes ion implantation to form a doped region 103 (e.g., n-type or p-type) between the isolation structures 104.

Figure 5:
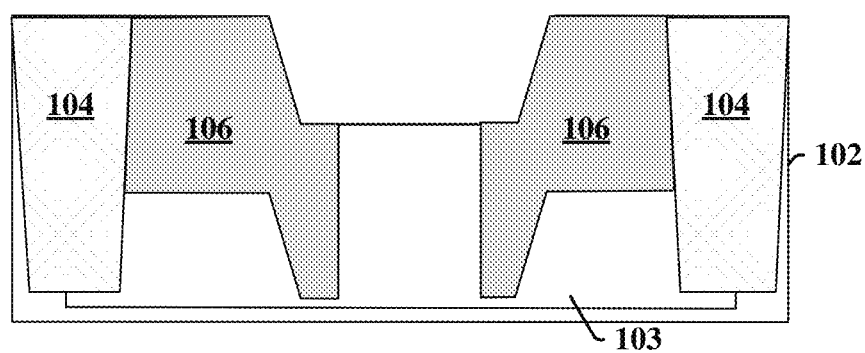

As shown in cross-sectional view 500 of FIG. 5, source/drain extension regions 106 are formed between the isolation structures 104 and portions of the recess 402 by using a mask (not shown). The mask covers a center portion of the recess 402 and optionally covers the isolation structures 104. In some embodiments, the mask may comprise a photosensitive material (e.g., photoresist) formed by a spin coating process and patterned by a photolithography process. In other embodiments, the mask may comprise a hard mask layer (e.g., a silicon nitride layer, a silicon carbide layer, or the like). Ion implantation is performed to dope the source/drain extension regions 106 to a different doping type than the doped region 103. For example, if the doped region 103 was n-type, then the source/drain extension regions 106 would be formed to be p-type. The mask is then removed.

Figure 6:
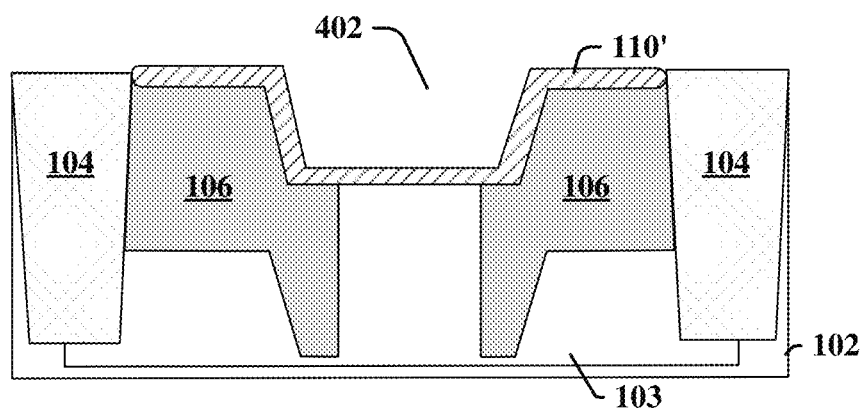

As shown in cross-sectional view 600 of FIG. 6, a continuous gate dielectric layer 110' is then deposited over the surface to cover the recess 402. The continuous gate dielectric layer 110', in some embodiments, may comprise silicon-dioxide, a high-k dielectric (e.g., hafnium-dioxide, zirconium-dioxide), or the like. The continuous gate dielectric layer 110' is, in some embodiments, grown by a thermal oxide process under high temperatures, resulting in a less porous and thus, more reliable continuous gate dielectric layer 110' than if the continuous gate dielectric layer 110' were to be formed by a CVD process. In some embodiments, the thickness of the continuous gate dielectric layer 110' is substantially uniform and may be in a range of approximately 100 angstroms to approximately 200 angstroms. In other embodiments (not shown), the recess 402 may have a depth ($h_1$ of FIG. 4) that is less than or equal to the thickness of the continuous gate dielectric layer 110', such that the continuous gate dielectric layer 110' completely fills the recess 402. In some embodiments, where the continuous gate dielectric layer 110' completely fills the recess 402 (not shown), the portion of the continuous gate dielectric layer 110' within the recess 402 may have a top surface that is above a topmost surface of the substrate 102.

Figure 7:
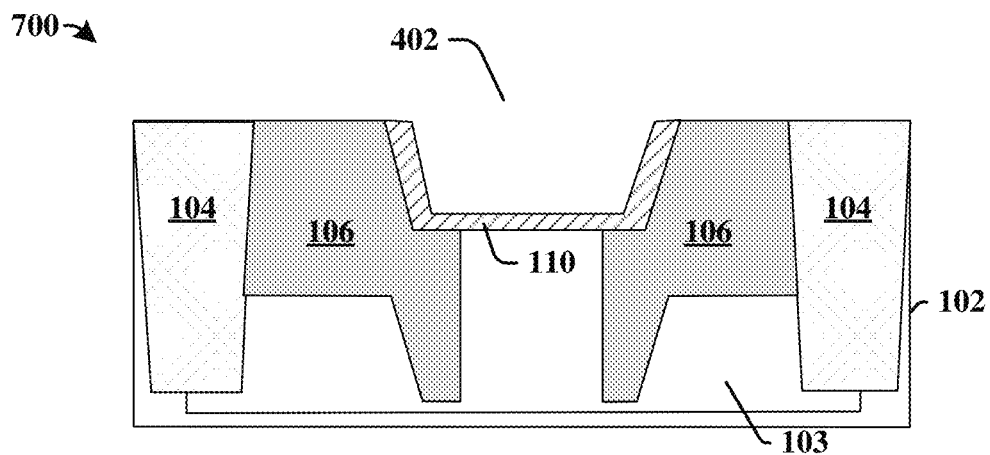

As shown in cross-sectional view 700 of FIG. 7, in some embodiments, the continuous gate dielectric layer 110' is removed such that the gate dielectric layer 110 is only covering sidewalls and a lower surface of the recess 402. The removal may be conducted by a planarization process, such as chemical mechanical planarization (CMP) such that topmost surfaces of the gate dielectric layer 110 are even with topmost surfaces of the substrate 102. In other embodiments, the removal may be conducted by an etching (e.g., wet etch or dry etch with a photomask in place). After the removal, the gate dielectric layer 110 covers all surfaces of the recess 402, as illustrated in FIG. 7.

Figure 8:
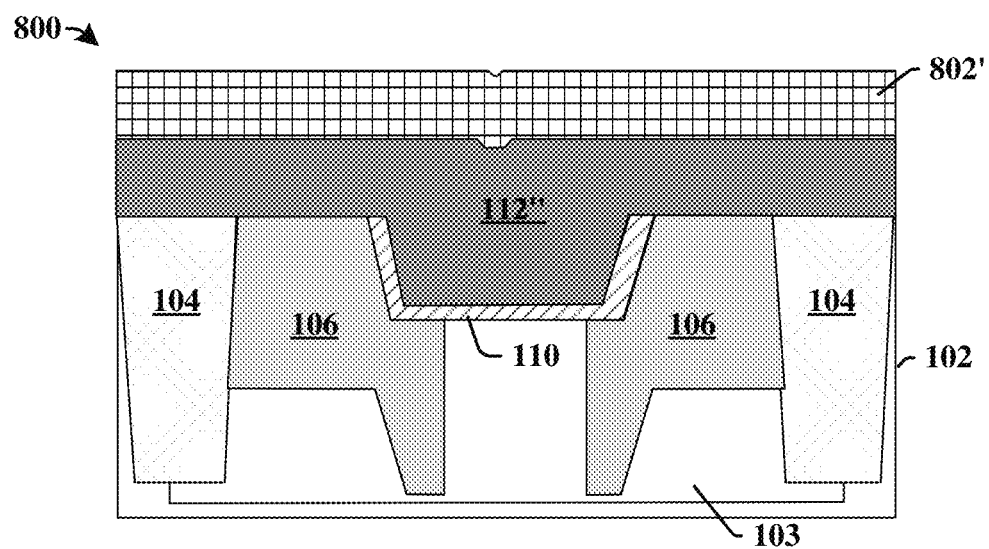

As shown in cross-sectional view 800 of FIG. 8, a conductive gate layer 112" is deposited and fills the recess 402. The gate layer 112" may be formed by way of a vapor deposition process (e.g., CVD, PE-CVD, PVD, or ALD), sputtering, or electroplating. In some embodiments, the gate layer 112" may comprise doped polysilicon. In some embodiments, the gate layer 112" may comprise a sacrificial gate material that is later replaced with a metal gate material, such as aluminum, cobalt, ruthenium, or the like, as a replacement gate process. A hard mask 802' (e.g., a silicon nitride layer, a silicon carbide layer, or the like) is deposited over the gate layer 112". In some embodiments (not shown), the gate layer 112" may be planarized (e.g., a CMP process)

such that subsequent deposited layers (e.g., the hard mask 802') have planar upper and lower surfaces.

Figure 9:
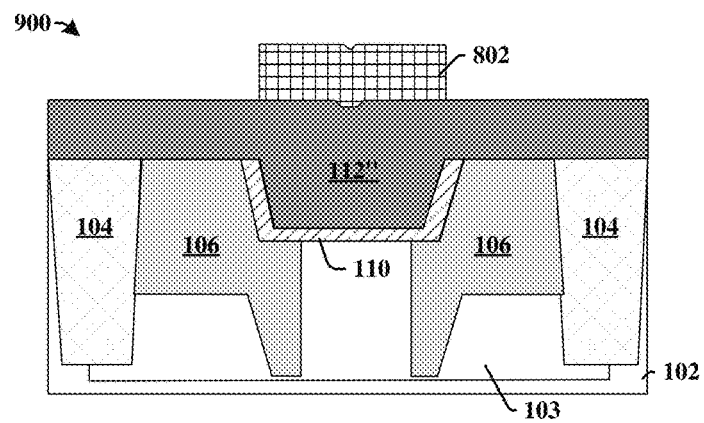

As shown in cross-sectional view 900 of FIG. 9, the hard mask 802' undergoes a patterning process (e.g., photolithography followed by selective etching) such that the patterned hard mask 802 is above the recess 402.

Figure 10A:
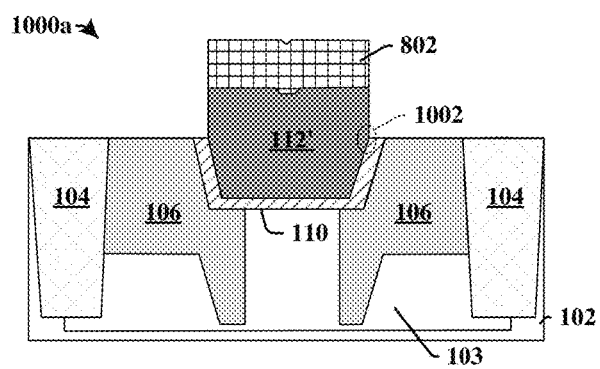
Figure 10B:
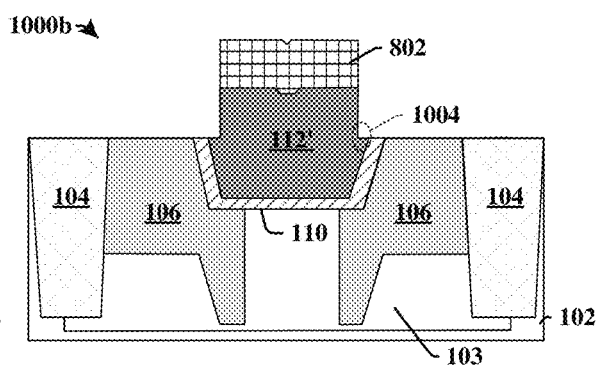
Figure 10C:
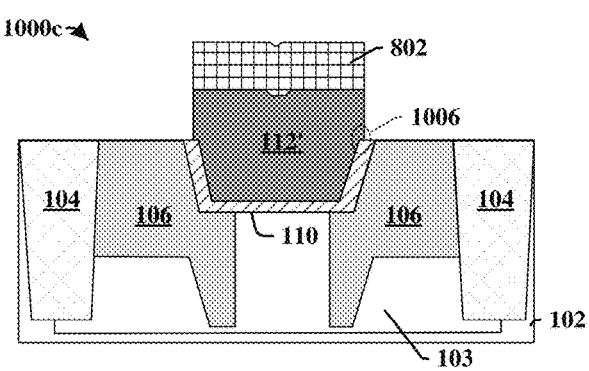

As shown in cross-sectional views of FIGS. 10A-10C, the gate layer 112" undergoes an etch using the patterned hard mask 802 to form a patterned gate layer 112'. The etch may be a wet etch or a dry etch. Because of the patterned gate layer 112' is patterned over the gate dielectric layer 110, the patterned gate layer 112' can have outer sidewalls that are aligned with inner sidewalls of the gate dielectric (see 1002 of FIG. 10A), can have outer sidewalls that are spaced apart from the inner sidewalls of the gate dielectric by a ledge (see 1004 of FIG. 10B), or can have outer sidewalls that protrude outward over the gate dielectric (see 1006 of FIG. 10C).

Figure 11:
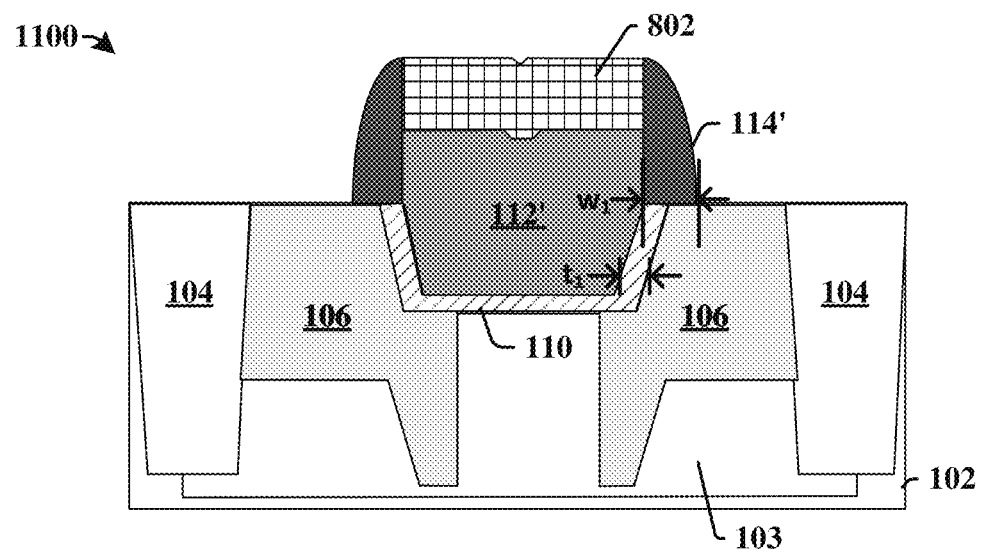

As shown in cross-sectional view 1100 of FIG. 11, sidewall spacers 114' are formed beside the patterned hard mask 802 and the patterned gate layer 112'; and above the gate dielectric layer 110 and portions of the source/drain extension regions 106. To form the sidewall spacers 114', a layer of material is deposited over the structure and then vertically etched to remove the substantially horizontal portions of the material. The material of the sidewall spacers 114' may be, for example, silicon dioxide, silicon nitride, some other dielectric, or a combination of the foregoing. After the etch, the sidewall spacers 114' often have curved outer sidewalls. The sidewall spacers 114' are formed to have a maximum width $w_1$ at the substrate 102 which is larger than a maximum thickness $t_1$ of the gate dielectric layer 110, such that the sidewall spacers 114' cover top surfaces of the gate dielectric layer 110 and portions of the source/drain extension regions 106. The maximum width $w_1$ of the sidewall spacers 114 may be, for example, in a range of between approximately 15 nanometers and approximately 100 nanometers.

Figure 12:
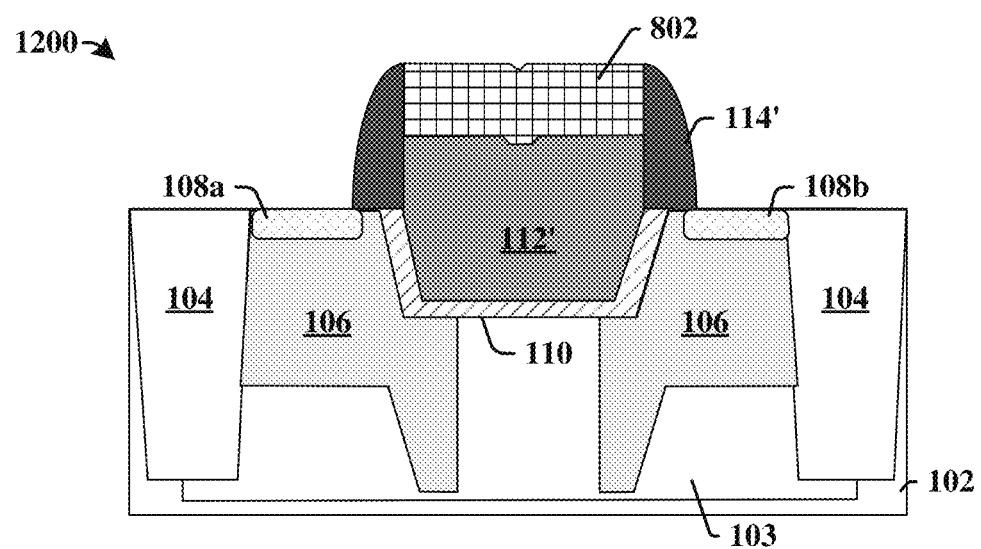

As shown in cross-sectional view 1200 of FIG. 12, a source region 108a and a drain region 108b are formed via ion implantation. The source region 108a and the drain region 108b may be formed by a self-aligned process wherein the patterned hard mask 802 over the patterned gate layer 112' and the sidewall spacers 114' act as a hard mask during the ion implantation. Thus, the sidewall spacers 114' and the isolation structures 104 have sidewalls that are substantially aligned with outer edges of the source region 108a and drain region 108b. The source and drain regions 108a, 108b have the same doping type as the source/drain extension regions 106, but also have a higher doping concentration than the source/drain extension regions 106.

Figure 13:
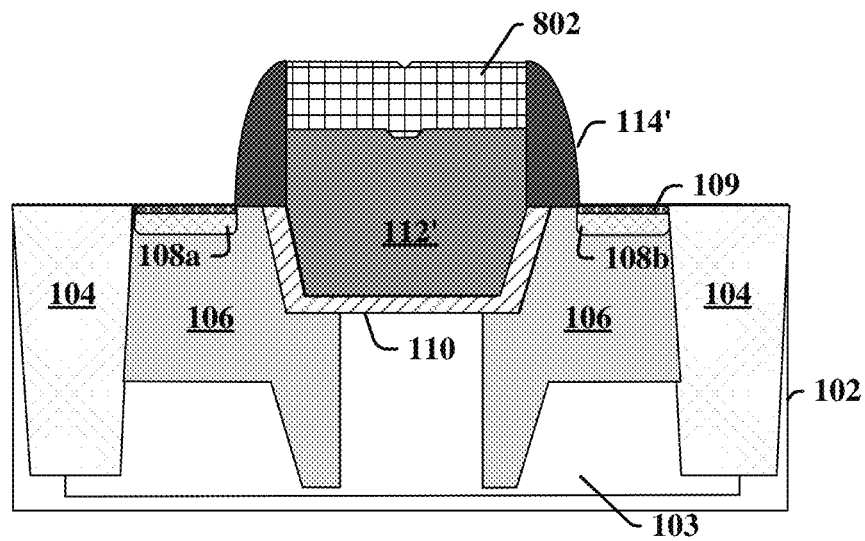

As shown in cross-sectional view 1300 of FIG. 13, silicide layers 109 may be formed over the source and drain regions 108a, 108b. Further, in some embodiments, an additional silicide layer (not shown) is formed on the gate layer 112'. The silicide layers 109 may, for example, be nickel silicide, titanium silicide, cobalt silicide, platinum silicide, tungsten silicide, or some other transition metal silicide. In some embodiments, a process for forming the silicide layers 109 comprises depositing a transition metal layer covering the structure of FIG. 13, and subsequently heating the transition metal layer so it reacts with exposed silicon to form the silicide layers 109. Further, in some embodiments, the process also comprises removing unreacted material of the transition metal layer by an etch. The silicide layers 109 are spaced apart from the gate dielectric layer 110 because the sidewall spacers 114' cover top surfaces of the gate dielectric layer 110 and a portion of the source/drain extension regions 106. If the sidewall spacers 114' were not wide enough such that the silicide layers 109 contacted the gate dielectric layer 110, the gate dielectric layer 110 would degrade and fail to prevent gate leakage from occurring.

Figure 14:
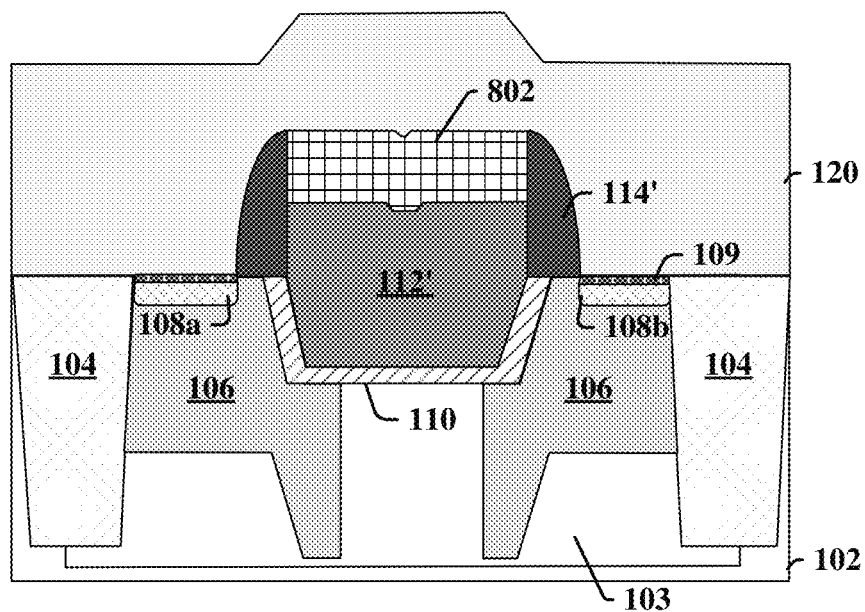

As shown in cross-sectional view 1400 of FIG. 14, an inter-layer dielectric (ILD) layer 120 (e.g., an oxide, a low-k dielectric, or an ultra low-k dielectric) is disposed over the structure of FIG. 13 to cover the patterned hard mask 802.

Figure 15:
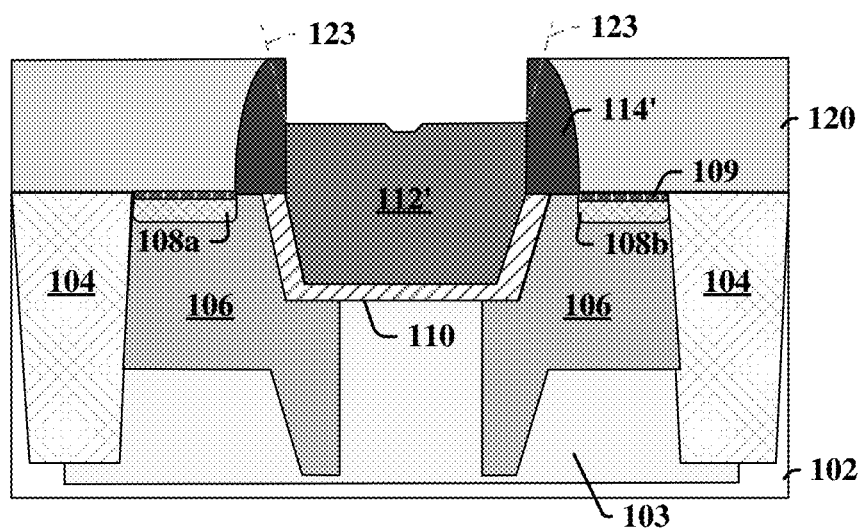

As shown in cross-sectional view 1500 of FIG. 15, a planarization process (e.g., a CMP process) is conducted on the ILD layer 120 to expose a top of the sidewall spacers 114' and a top of the patterned hard mask 802 of FIG. 14. Depending on the extent of CMP, the sidewall spacers may be left with rounded upper surfaces, or may have planarized upper surfaces as illustrated in FIG. 15. A selective etch is then conducted to remove the patterned hard mask 802. The selective etch can leave the sidewall spacers 114' with vertical sidewalls as illustrated, or if inner portions of the sidewall spacers 114' are removed during the selective etch for example, which may occur if the sidewall spacers 114' and the patterned hard mask 802 are made of the same material (e.g., silicon nitride), the selective etch can leave the sidewall spacers with upper inner sidewalls that are angled as shown by 123 (while still retaining lower vertical sidewalls that contact the patterned gate layer 112'). To protect the ILD layer 120 during the selective etch, another patterned mask (e.g., a photomask and/or nitride hard mask) may be used above the ILD layer 120 (not shown).

Figure 16:
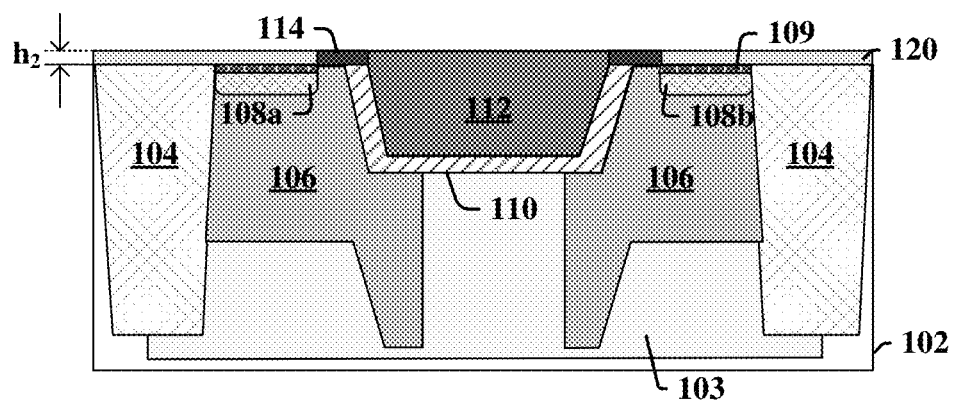

As shown in cross-sectional view 1600 of FIG. 16, another optional planarization process (e.g., a CMP process) is conducted to planarize a top surface of the gate 112. After the planarization process, a top portion of the gate 112 is above the top surface of the substrate 102 by a height $h_2$, which may measure to be in a range of between approximately 0 angstroms to approximately 200 angstroms. A top surface of the sidewall spacers 114 are also planar from the planarization process. A portion of the ILD layer 120 remains. In some cases, the planarization may stop so upper surfaces of the spacers are spaced above the top surface of the gate 112, ultimately resulting in a structure such as shown in FIG. 2.

Figure 17:
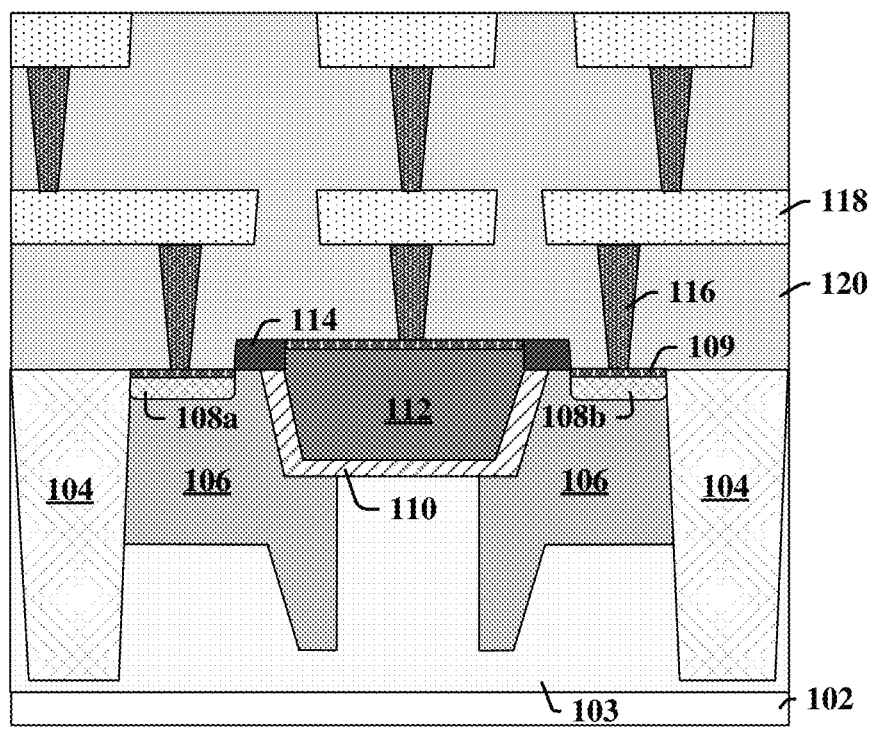

As shown in cross-sectional view 1700 of FIG. 17, a back end of line (BEOL) process is performed to add contacts 116 and interconnect metal layers 118 embedded in additional ILD layers 120 such that the MOSFET can be coupled to more devices (e.g., semiconductor device 300).

Figure 18:
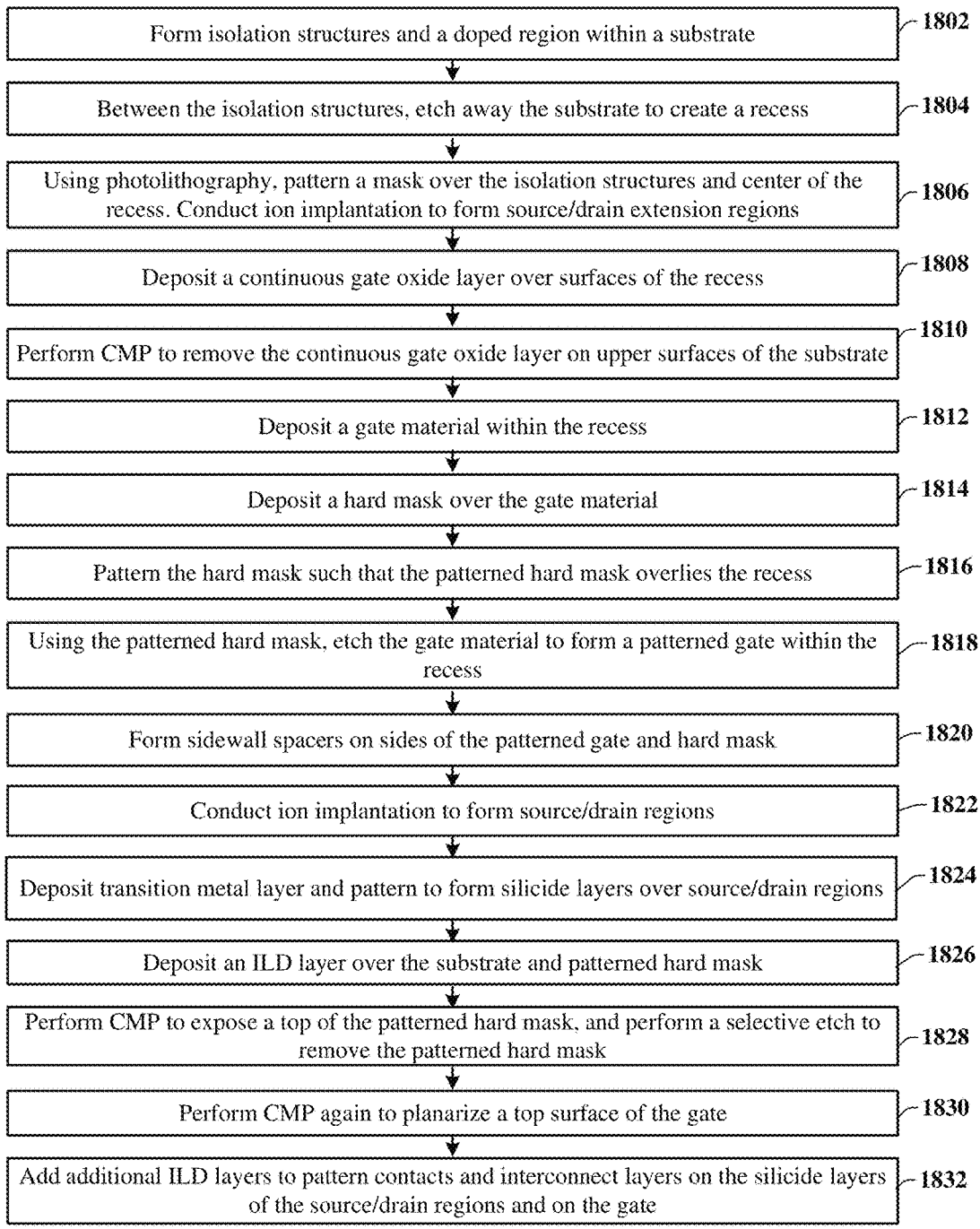
FIG. 18 illustrates a flow diagram of some embodiments of a method of forming a MOSFET comprising a gate structure recessed below a top surface of a substrate.

FIG. 18 illustrates a flow diagram of some embodiments of a method 1800 of forming a MOSFET with a recessed gate.

While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, isolation structures and a doped region are formed within a substrate.

Figure 4:
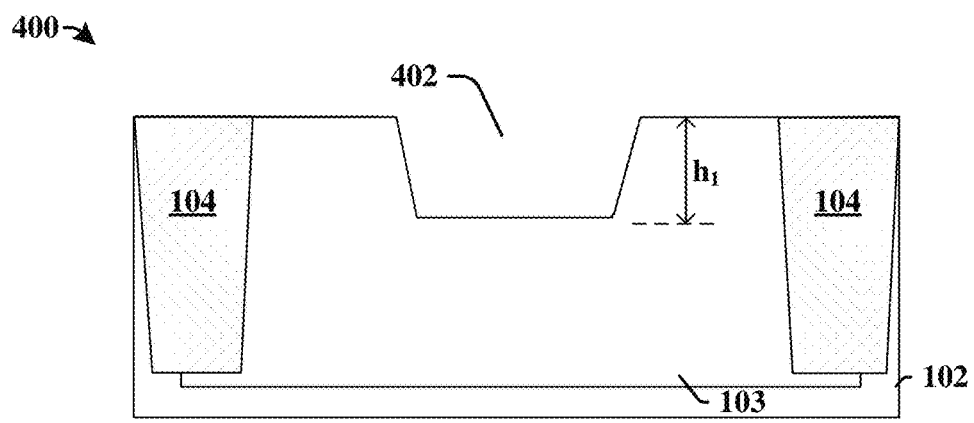
FIGS. 4-17 illustrate cross-sectional views of some embodiments of a method of forming a MOSFET comprising a gate structure recessed below a top surface of a substrate.

At 1804, an etch is performed to form a recess in the substrate and between the isolation structures. FIG. 4 illustrates a cross-sectional view 400 of some embodiments corresponding to acts 1802 and 1804.

At 1806, using photolithography, a mask is patterned over the isolation structures and center of the recess. Ion implantation is conducted using the mask to from source/drain extension regions. FIG. 5 illustrates a cross-sectional view 500 of some embodiments corresponding to act 1806.

At 1808, a continuous gate dielectric layer is deposited over surfaces of the recess. FIG. 6 illustrates a cross-sectional view 600 of some embodiments corresponding to act 1808.

At 1810, a planarization process (e.g., a CMP process) is used to remove the continuous gate dielectric layer on upper surfaces of the substrate. FIG. 7 illustrates a cross-sectional view 700 of some embodiments corresponding to act 1810.

At 1812, a gate material is deposited within the recess.

At 1814, a hard mask is deposited over the gate material. FIG. 8 illustrates a cross-sectional view 800 of some embodiments corresponding to acts 1812 and 1814.

At 1816, the hard mask is patterned such that the patterned hard mask overlies the recess. FIG. 9 illustrates a cross-sectional view 900 of some embodiments corresponding to act 1816.

At 1818, the gate material is etched using the patterned hard mask to form a patterned gate within the recess. FIGS. 10A-10C illustrate cross-sectional views 1000a-1000c of some embodiments corresponding to act 1818.

At 1820, sidewall spacers are formed to cover sides of the patterned gate and the hard mask. FIG. 11 illustrates a cross-sectional view 1100 of some embodiments corresponding to act 1820.

At 1822, ion implantation is conducted to form a source region and a drain region. FIG. 12 illustrates a cross-sectional view 1200 of some embodiments corresponding to act 1822.

At 1824, a transition metal layer is deposited and patterned to form silicide layers over the source and drain regions. FIG. 13 illustrates a cross-sectional view 1300 of some embodiments corresponding to act 1824.

At 1826, an ILD layer is deposited over the substrate and the patterned hard mask. FIG. 14 illustrates a cross-sectional view 1400 of some embodiments corresponding to act 1826.

At 1828, a planarization process (e.g., a CMP process) is performed to expose a top of the patterned hard mask. A selective etch is then performed to remove the patterned hard mask. FIG. 15 illustrates a cross-sectional view 1500 of some embodiments corresponding to act 1828.

At 1830, a planarization process (e.g., a CMP process) is performed again to planarize a top surface of the gate. FIG. 16 illustrates a cross-sectional view 1600 of some embodiments corresponding to act 1830.

At 1832, additional ILD layers are added and contacts and interconnect layers are patterned on the silicide layers of the source/drain regions and on the gate. FIG. 17 illustrates a cross-sectional view 1700 of some embodiments corresponding to act 1832.

Accordingly, in some embodiments, the present disclosure relates to a semiconductor device comprising a doped region with a substrate. A source region and a drain region are arranged within the substrate on opposite sides of the doped region. A conductive gate is disposed over the doped region. A gate dielectric layer is disposed on the doped region between the source region and the drain region and separates the conductive gate from the doped region. A bottommost surface of the gate dielectric layer is below a topmost surface of the substrate. A first sidewall spacer is arranged along a first side of the conductive gate and includes a first inner portion that contacts the first side of the conductive gate and a first peripheral portion spaced apart from the first side of the conductive gate by the first inner portion. The first inner portion covers a first top surface of the gate dielectric layer. A drain extension region is arranged under the first sidewall spacer and separates the drain region from the gate dielectric layer. A second sidewall spacer is arranged along a second side of the conductive gate and includes a second inner portion that contacts the second side of the conductive gate and a second peripheral portion spaced apart from the second side of the conductive gate by the second inner portion. The second inner portion covers a second top surface of the gate dielectric layer. A source extension region is arranged under the second sidewall spacer and separates the source region from the gate dielectric layer.

In other embodiments, the present disclosure relates to a semiconductor device. The semiconductor device includes a doped region within a substrate, and a source and drain region within the doped region. A gate is arranged between the source and drain region and has a bottommost surface that is below a topmost surface of the substrate. Additionally, the gate has a topmost surface that is above a topmost surface of the substrate. A gate dielectric layer is arranged below the gate and separates the gate from the doped region. Sidewall spaces surround outermost surfaces of the gate and cover top surfaces of the gate dielectric layer. The sidewall spacers have a maximum width that is larger than a maximum thickness of the gate dielectric layer so that inner edges of the source region and the drain region are spaced apart from outer edges of the gate dielectric layer. A first silicide layer and a second silicide layer are arranged over the source region and the drain region, respectively. Additionally, the first silicide layer and the second silicide layers are spaced apart from the outer edges of the gate dielectric layer.

In yet other embodiments, the present disclosure relates to a method of forming a semiconductor device. The method includes performing a first etching process by selectively exposing a substrate to a first etchant to produce a recess. The recess is defined by sidewalls and a bottom surface, the bottom surface of the recess being below a topmost surface of the substrate. A gate dielectric layer is then formed over the sidewalls and the bottom surface of the recess. A gate layer is deposited over the substrate. The gate layer has a center portion that is over the recess and in contact with the gate dielectric layer and surrounding outer portions of the gate layer. A second etching process is performed on the gate layer to remove outer portions of the gate layer by using a patterned hard mask over the center portion of the gate layer. Sidewall spacers are formed along sidewalls of the gate layer and above the gate dielectric layer. The sidewall spacers are formed to have a maximum width that is larger than a maximum thickness of the gate dielectric layer. Source/drain regions are formed using the sidewall spacers as a mask, such that innermost edges of the source/drain regions are spaced apart from outermost edges of the gate dielectric layer. A planarization process is then performed to remove the patterned hard mask such that top surfaces of the sidewall spacers and the gate layer are substantially planar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
performing a first etching process by selectively exposing a substrate to a first etchant to produce a recess, wherein the recess is defined by sidewalls and a bottom surface, the bottom surface of the recess being below a topmost surface of the substrate;
doping the substrate to form a source extension region and a drain extension region respectively on opposite sides of the recess, wherein the source and drain extension regions extend from directly under the recess to the topmost surface of the substrate;
forming a gate dielectric layer over the sidewalls and the bottom surface of the recess;
forming a gate layer over the substrate, wherein a center portion of the gate layer is over the recess and in contact with the gate dielectric layer, the center portion of the gate layer surrounded by outer portions of the gate layer;
performing a second etching process on the gate layer to remove the outer portions of the gate layer by using a patterned hard mask over the center portion of the gate layer;
forming sidewall spacers along sidewalls of the gate layer and above the gate dielectric layer, wherein the sidewall spacers have a maximum width that is larger than a maximum thickness of the gate dielectric layer;
forming source/drain regions using the sidewall spacers as a mask, such that innermost edges of the source/drain regions are spaced apart from outermost edges of the gate dielectric layer, wherein the source/drain regions are respectively and directly on the source and drain extension regions; and
performing a planarization process such that top surfaces of the sidewall spacers and the gate layer are substantially planar;
wherein the gate layer is formed before the forming of the source/drain regions and after the doping to form the source extension region and the drain extension region, and wherein the source and drain extension regions are closer to a bottom surface of the substrate directly under the gate layer than directly under the source/drain regions.

2. The method of claim 1, further comprising:
forming silicide layers on the source/drain regions, wherein the sidewall spacers prevent the silicide layers from contacting the gate dielectric layer.

3. The method of claim 2, further comprising:
forming a gate silicide layer on the gate layer, wherein the sidewall spacers prevent the gate silicide layer from contacting the gate dielectric layer.

4. The method of claim 1, further comprising:
performing a second planarization process to remove the gate dielectric layer from the topmost surface of the substrate while leaving the recess covered with the gate dielectric layer, wherein the second planarization process is performed before the forming of the gate layer.

5. The method of claim 1, wherein an outer portion of the sidewall spacers overlies the topmost surface of the substrate.

6. The method of claim 1, wherein the gate dielectric layer fills the recess such that a top surface of the gate dielectric layer is above the topmost surface of the substrate.

7. A method of forming a semiconductor device, comprising:
performing a first etch into a substrate to form a recess;
depositing a gate dielectric layer lining and partially filling the recess, and further overlying a top surface of the substrate;
performing a planarization into the gate dielectric layer until a top surface of the gate dielectric layer is level with the top surface of the substrate;
depositing a conductive layer covering the gate dielectric layer and filing a remainder of the recess after the planarization;
forming a mask overlying the conductive layer and the recess;
performing a second etch into the conductive layer with the mask in place to form a gate electrode overlying the gate dielectric layer;
doping the substrate to form a source region and a drain region respectively on opposite sides of the gate electrode and spaced from the gate dielectric layer;
depositing an interlayer dielectric (ILD) layer covering the source and drain regions and the mask;
performing a second planarization into the ILD layer to expose the mask; and
removing the mask to form an opening exposing the gate electrode.

8. The method according to claim 7, wherein the removing of the mask from atop the gate electrode is after the doping.

9. The method according to claim 7, further comprising:
forming a sidewall spacer structure comprising a first spacer segment and a second spacer segment bordering the gate electrode respectively on the opposite sides of the gate electrode, wherein the first and second spacer segments directly contact the top surface of the substrate from the gate dielectric layer respectively to the source and drain regions.

10. The method according to claim 9, further comprising:
doping the substrate to form a source extension region in the substrate, wherein the first spacer segment directly contacts the source extension region.

11. The method according to claim 9, wherein the first and second spacer segments directly contact the top surface of the gate dielectric layer.

12. The method according to claim 7, further comprising:
forming a sidewall spacer structure comprising a first spacer segment and a second spacer segment bordering the gate electrode respectively on the opposite sides of the gate electrode, wherein the ILD layer is deposited covering the first and second spacer segments, and wherein the removing of the mask exposes sidewalls of the first and second spacer segments in the opening.

13. The method according to claim 7, wherein the gate dielectric layer has a pair of sidewalls facing away from the recess and respectively on opposite sides of the recess, and wherein the mask has a pair of sidewalls respectively on the opposite sides of the recess and laterally between the sidewalls of the gate dielectric layer.

14. A method of forming a semiconductor device, comprising:
patterning a top surface of a substrate to form a recess;
doping the substrate to form a source extension region in the substrate;
forming a gate stack in the recess after the doping, wherein the gate stack comprises a gate dielectric layer and a gate electrode overlying the gate dielectric layer, wherein a bottom surface of the gate electrode is recessed relative to the top surface of the substrate;

depositing a spacer layer covering the gate stack and the substrate, and further lining sidewalls of the gate electrode;

etching back the spacer layer to form a sidewall spacer structure comprising a first spacer segment and a second spacer segment bordering the gate electrode respectively on opposite sides of the gate electrode; and doping the substrate with the first and second spacer segments in place to form a source region and a drain region respectively on the opposite sides of the gate electrode;

wherein the first and second spacer segments directly contact the top surface of the substrate from the gate dielectric layer respectively to the source and drain regions, wherein the doping to form the source extension region implants dopants into the substrate through a bottom of the recess and while the recess is exposed, wherein the gate dielectric layer has a sidewall facing away from the recess, wherein the first spacer segment is formed directly over and contacting a top edge of the sidewall, and wherein the top edge is offset from sidewalls of the first spacer segment.

15. The method according to claim 14, wherein the first and second spacer segments overlie and directly contact a top surface of the gate dielectric layer.

16. The method according to claim 15, wherein the top surface of the gate dielectric layer is level with the top surface of the substrate.

17. The method according to claim 14, wherein the doping to form the source extension region is before the forming of the gate stack, and wherein the source region is formed overlying the source extension region.

18. The method according to claim 17, wherein a depth to which the source extension region extends into the substrate decreases from the recess laterally in a direction away from the recess.

19. The method of claim 14, further comprising:
forming silicide layers on the source region and the drain region, wherein the sidewall spacer structure prevents the silicide layers from contacting the gate dielectric layer.

20. The method of claim 19, further comprising:
forming a gate silicide layer on the gate electrode, wherein the sidewall spacer structure prevents the gate silicide layer from contacting the gate dielectric layer.

* * * * *